United States Patent [19]
Iwabuchi et al.

[11] Patent Number: 5,811,854
[45] Date of Patent: Sep. 22, 1998

[54] ONE PIECE SEMICONDUCTOR DEVICE HAVING A POWER FET AND A LOW LEVEL SIGNAL ELEMENT WITH LATERALLY SPACED BURIED LAYERS

[75] Inventors: Akio Iwabuchi, Tokyo; Kazuyoshi Sugita, Iwatsuki, both of Japan

[73] Assignee: Sanken Electric Co., Ltd., Saitama-ken, Japan

[21] Appl. No.: 914,588

[22] Filed: Aug. 18, 1997

[30] Foreign Application Priority Data

Aug. 23, 1996 [JP] Japan .................................. 8-241157

[51] Int. Cl.$^6$ .............................. H01L 29/10; H01L 29/78
[52] U.S. Cl. ...................... 257/341; 257/349; 257/367; 257/372; 257/409; 257/500; 257/502; 257/546; 257/549
[58] Field of Search ...................... 257/339, 341, 257/342, 349, 351, 367–369, 372, 409, 490, 500–504, 544–546, 549

[56] References Cited

FOREIGN PATENT DOCUMENTS

003902641 A   8/1990   Germany .............................. 257/577

Primary Examiner—Tom Thomas
Assistant Examiner—Fetsum Abraham
Attorney, Agent, or Firm—Woodcock Washburn Kurtz Mackiewicz & Norris LLP

[57] ABSTRACT

A composite semiconductor device comprised of a power MOS FET and a low level signal element. The MOS FET includes an n type buried layer embedded between p type substrate and n type epitaxial layer. As conventionally formed due to the pn junctions between the p substrate and the n epitaxial layer, and between the p substrate and the n buried layer, the depletion layers had abrupt transitions therebetween, inviting field concentrations and consequent voltage drops. In order to mitigate the abrupt transitions, one or more n type additional buried regions are provided in and between the substrate and the epitaxial layer and in the adjacency of the buried layer. The additional buried regions are higher in impurity concentration than the epitaxial layer.

8 Claims, 4 Drawing Sheets

5,811,854

1

ONE PIECE SEMICONDUCTOR DEVICE HAVING A POWER FET AND A LOW LEVEL SIGNAL ELEMENT WITH LATERALLY SPACED BURIED LAYERS

BACKGROUND OF THE INVENTION

This invention relates to semiconductor devices In general and, in particular, to a composite semiconductor device integrally comprising an insulated gate (IG) or metal oxide silicon (MOS) field effect transistor (FET) for handling relatively high current and power, and a low level signal element of lower current carrying capacity.

The composite semiconductor device has been known which is a one piece construction of a power MOS FET and a low level signal element (shown in FIG. 1 of the drawings attached hereto). As heretofore constructed, the MOS FET of the composite semiconductor device was unsatisfactory in its voltage withstanding capability. The instant applicant has discovered that this drawback is attributable to abrupt bends or transitions between depletion layers created within the device upon application of a high voltage. Such abrupt bends are easy to invite field concentrations and resulting voltage drops.

SUMMARY OF THE INVENTION

The present invention seeks to enable the FET of the composite semiconductor device of the kind in question to withstand higher voltages than heretofore.

Briefly, the invention may be summarized as a composite semiconductor device of one piece construction having an insulating gate field effect transistor and a low level signal element, the latter being less in current carrying capacity than the field effect transistor. The device comprises a first semiconductor region of a first conductivity type; a second semiconductor region of a second conductivity type, opposite to the first conductivity type, which is disposed contiguous to a major surface of the first semiconductor region and partly embedded therein; a third semiconductor region of the second conductivity type which is lower in impurity concentration than the second semiconductor region, and which is disposed contiguous to the major surface of the first semiconductor region, so that the second semiconductor region is buried in and between the first and the third semiconductor regions; a fourth semiconductor region of the second conductivity type which is higher in impurity concentration than the third semiconductor region, and which is formed in the third semiconductor region so as to form a drain of a field effect transistor; a fifth semiconductor region of the first conductivity type disposed contiguous to the major surface of the first semiconductor region and to the third semiconductor region while being spaced from the second semiconductor region; and a sixth semiconductor region of the second conductivity type formed in the fifth semiconductor region so as to form a source of the field effect transistor. The invention features at least one additional buried semiconductor region of the second conductivity type, higher in impurity concentration than the third semiconductor region, which is buried in and between the first and the third semiconductor regions and disposed adjacent the buried second semiconductor region.

Preferably embedded in the first semiconductor region to a depth less than the second semiconductor region is, or made less in impurity concentration than the second semiconductor region, the additional buried region or regions function to provide more streamlined depletion layers than heretofore. The power FET will therefore withstand higher voltages.

2

The above and other objects, features and advantages of this invention and the manner of realizing them will become more apparent, and the invention itself will best be understood, from a study of the following description and appended claims, with reference had to the attached drawings showing some preferred embodiments of the invention.

DETAILED DESCRIPTION

Figure 1:
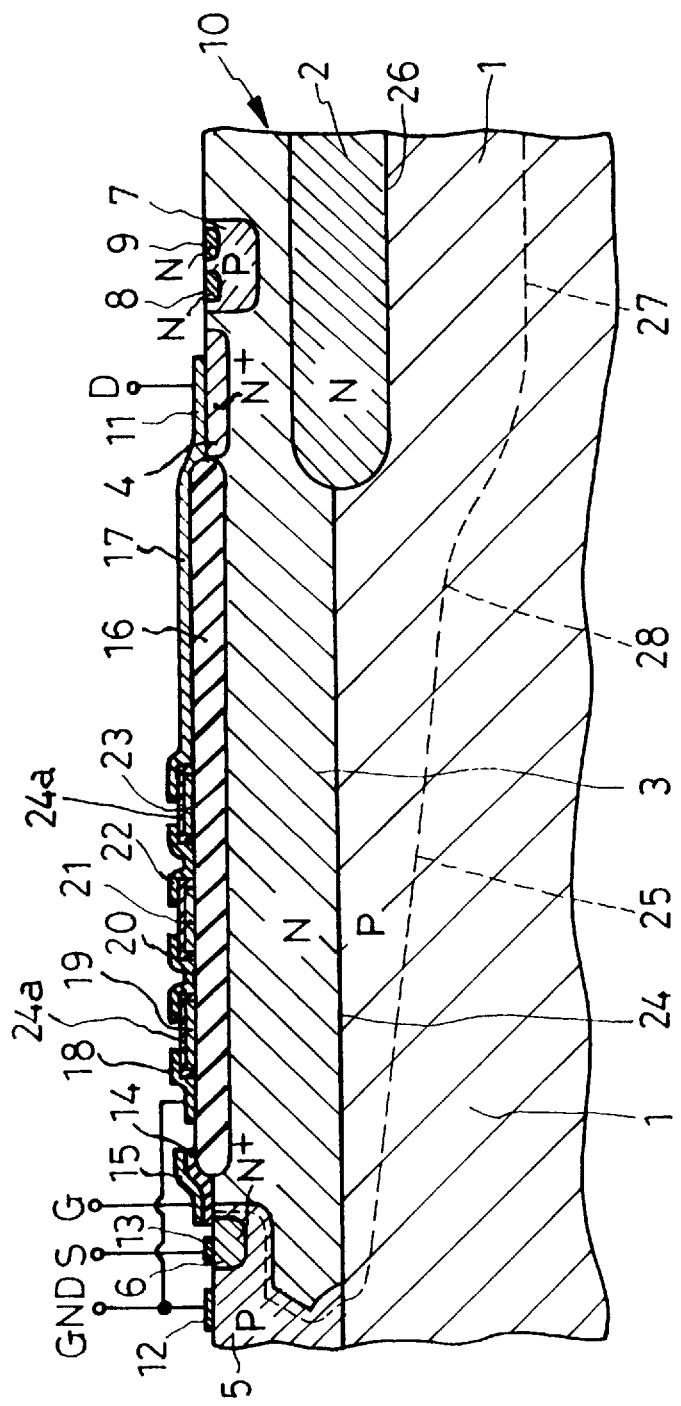
FIG. 1 is a fragmentary section through the prior art composite semiconductor device under consideration.

It is considered essential that the prior art composite semiconductor device be shown and described in more detail, the better to make clear the features and advantages of the instant invention. The prior art semiconductor device shown in FIG. 1, which integrally combines a power MOS FET and a low level signal element, comprises a p type first semiconductor region 1, an n type second semiconductor region or buried layer 2, an n type third semiconductor region 3, an n$^+$ type fourth semiconductor region 4 which forms the drain of a power MOS FET, a p type fifth semiconductor region or channel 5, and an n$^-$ type sixth semiconductor region or source 6. Additionally, the prior art device includes a p type region 7, with n type regions 8 and 9 formed therein, for providing a low level signal semiconductor element or MOS FET.

The first semiconductor region 1 is a substrate. The second semiconductor region 2 is formed approximately centrally of a major surface of the substrate 1 by impurity diffusion and partly embedded therein. Lower in impurity concentration than the second semiconductor region 2, the third semiconductor region 3 is formed by epitaxial growth on the first semiconductor region 1, thereby burying the second semiconductor region 2, and is contiguous to both first and second semiconductor regions. Higher in impurity concentration than the third semiconductor region 3, the fourth semiconductor region 4 is formed by impurity diffusion on the third semiconductor region. The fifth semiconductor region 5 is formed annularly in the third semiconductor region 3 by impurity diffusion so as to be exposed on the surface of the semiconductor chip 10 and contiguous to the first semiconductor region 1. The sixth semiconductor region 6 is formed annularly In the fifth semiconductor region 5 by impurity diffusion so as to be opposed to the third semiconductor region 3 across part of the fifth semiconductor region 5.

The regions 7, 8 and 9, which in combination constitute a low level signal element, are formed by impurity diffusions In that part of the third semiconductor region 3 which overlies the buried second semiconductor region 2. The low level signal element is herein shown to comprise only the body 7, source 8 and drain 9, although in practice it must additionally comprise various other means for driving or controlling the power MOS FET, as well as electrodes and insulations.

The power MOS FET of the prior art device is provided with a drain electrode 11, a ground electrode 12 and a source electrode 13, all of annular shape, on the semiconductor regions 4, 5 and 6, respectively. An annular gate electrode 15 is also formed via an insulating film 14 on that part of the fifth semiconductor region 5 which lies between third semiconductor region 3 and sixth semiconductor region 6.

In order to favorably obtain a field plate effect, and to enable the device to withstand higher voltages, a silicon oxide film 16 is provided on that part of the third semiconductor region 3 which lies between the fourth and the fifth semiconductor regions 4 and 5, and on this silicon oxide film there are formed a first metal layer 17 electrically connected to the drain electrode 11, a second metal layer 18 electrically connected to the ground electrode 12, and one or more intermediate metal layers 19, 20, 21, 22 and 23. Dielectric layers 24a intervene between first metal layer 17 and intermediate metal layer 23, between second metal layer 18 and intermediate metal layer 19, and between the intermediate metal layers 19–23. Consequently, there are obtained a plurality of capacitors which are in serial connection between drain electrode 11 and ground electrode 12.

Figure 2:
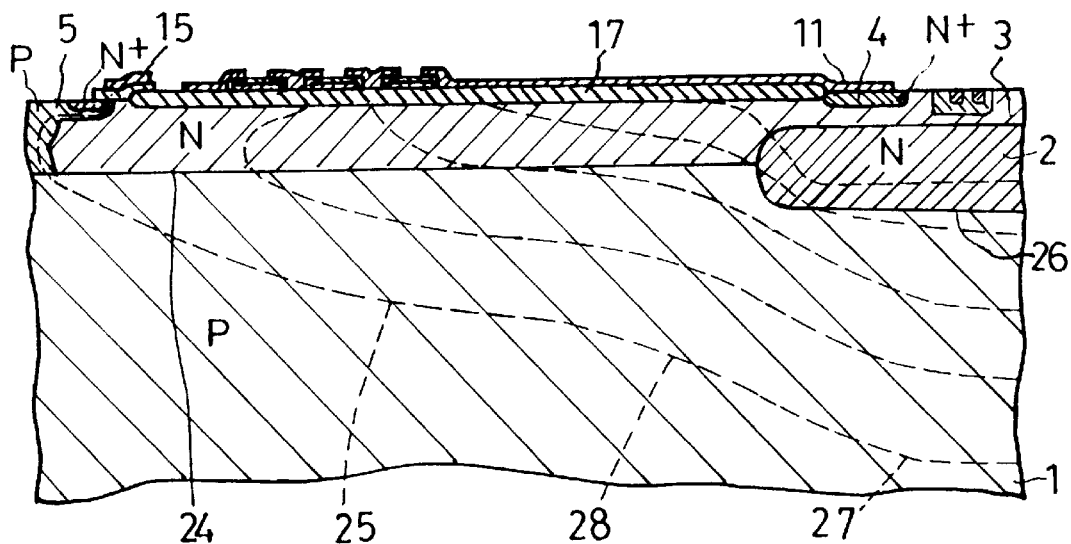
FIG. 2 is a view somewhat similar to FIG. 1 but explanatory in particular of depletion layers created in the prior art device.

Upon application of a high voltage between the drain electrode 11 and ground electrode 12 of the prior art FET, the pn junction between the p type first and the n type third semiconductor regions 1 and 3 will be reverse biased, resulting in the creation of a depletion layer, as indicated by the broken line designated 25 in both FIGS. 1 and 2. At the same time the pn junction 26 between the p type first and the n type second semiconductor regions 1 and 2 will also be reverse biased, again resulting in the creation of a depletion layer 27. Although FIG. 1 shows the depletion layers 25 and 27 as spreading only in the first semiconductor region 1, in fact they will spread through the second and the third semiconductor regions 2 and 3 as well, as indicated in FIG. 2.

The buried second semiconductor layer 2 is intended to prevent the depletion layer 27 from punching through the third semiconductor region 3 to the low level signal element region 7 and so forth. Typically, the impurity concentration of this second semiconductor region is $6 \times 10^{15}$ cm$^{-3}$, which is higher than that of the overlying third semiconductor region 3. Being formed by impurity diffusion, the second semiconductor region 2 partly intrudes into the underlying first semiconductor region 1, to such an extent that the pn junction 26 is significantly offset into the substrate 1 from the pn junction 24. Rather abrupt bends or transitions 28 have therefore been so far created between the depletion layers 25 and 27, inviting field concentrations at these transitions and, in consequence, breakdown.

In order to create the depletion layers 25 and 27 so as to mitigate field concentrations, it might be contemplated to lower the impurity concentrations of the p type first semiconductor region 1 and n type second and third semiconductor regions 2 and 3. This remedy is unpractical for the following reasons.

First of all, being ordinarily made from of a substrate fabricated by the familiar Chokralsky method, the first semiconductor region 1 can have its impurity concentration lowered only to $2.5 \times 10^{14}$ cm$^{-3}$ or so. A further reduction in impurity concentration is itself possible with substrates made by the known floating zone method. The substrates made by this second known method are generally so low in oxygen contents, however, that crystal defects are liable to occur in the course of heat treatment conducted during the formation of the buried second semiconductor region 2. Excessive reduction in the impurity concentration of the first semiconductor region 1 is additionally undesirable by reason of the possibly accompanying parasitic operation of the low level signal semiconductor element. The impurity concentration of the second semiconductor region cannot be lowered too much in order to prevent the punch through noted above. The third semiconductor region 3 takes part in the formation of the low level signal semiconductor element, so that its impurity concentration cannot be lowered so much as to adversely affect the desired characteristics of the semiconductor element.

The present invention will now be described in detail in terms of its preferable embodiment illustrated in FIGS. 3–8. A comparison of FIG. 4 with FIG. 1 will best indicate that the illustrated semiconductor device according to the invention is akin to the prior art device except for two additional, floating or buried n type semiconductor regions 31 and 32. All the other parts of the inventive device have their counterparts in the prior art device, so that such parts are designated by the same reference characters as used to denote their counterparts, and their description will be omitted.

Being parts of the power MOS FET, the two additional regions 31 and 32 may be referred to as the seventh and the eighth semiconductor regions, respectively, in addition to the six semiconductor regions 1–6 of the MOS FET set forth previously in connection with the illustrated prior art.

Figure 3:
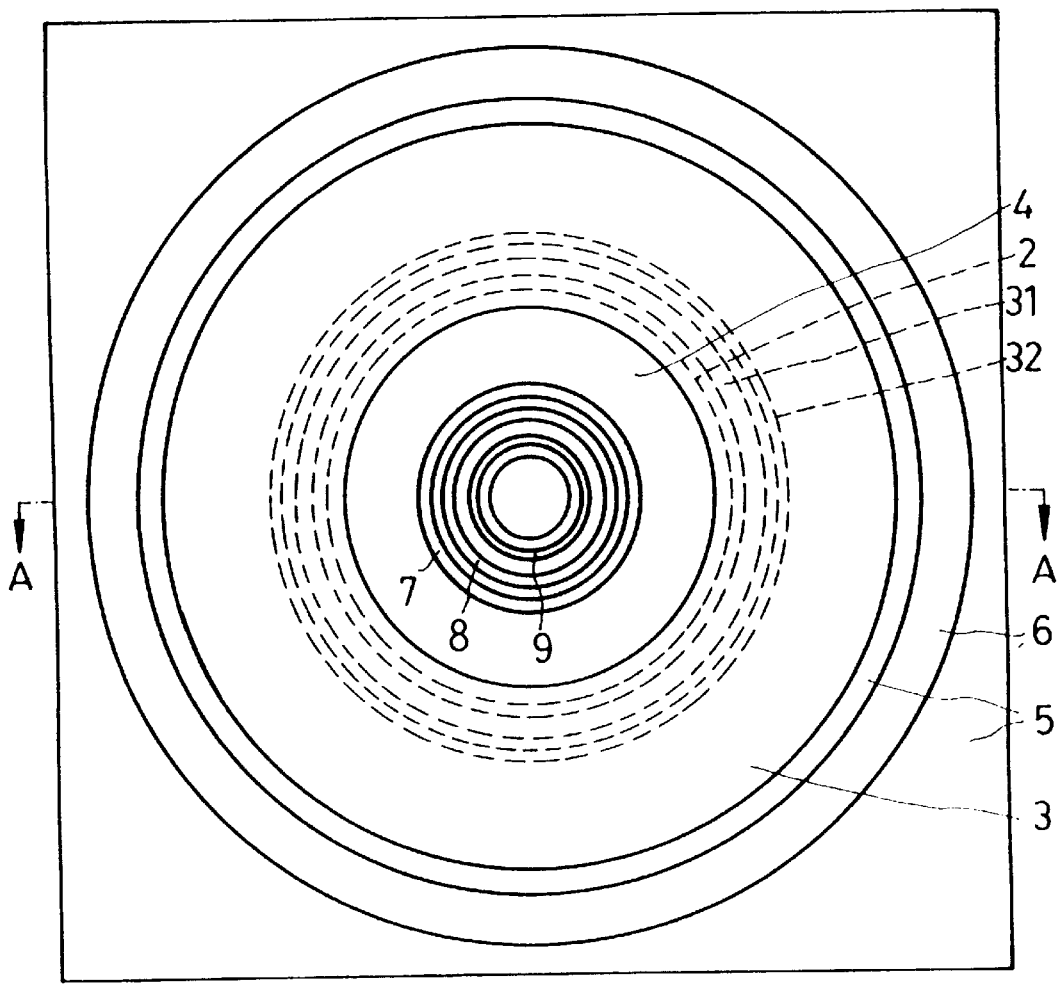
FIG. 3 is a top plan of the improved composite semiconductor device constructed in accordance with the concepts of the present invention.

As will be noted from FIG. 3, the seventh and the eighth semiconductor regions 31 and 32 are both annular in shape, concentrically surrounding the buried second semiconductor region 2. Like this second semiconductor region the regions 31 and 32 are buried between the first and the third semiconductor regions 1 and 3, partly embedded in the first region. The depths $D_2$ and $D_3$ to which the regions 31 and 32 are embedded in the first region 1 are both less than the depth $D_1$ of embedment of the second region 2 in the first region. Further the seventh region 31 is greater than the eighth region 32 in both cross sectional size and depth of embedment in the first region 1.

In impurity concentration, on the other hand, the two additional regions 31 and 32 are less than the second semiconductor region 2 and more than the third semiconductor region 3. The typical maximum impurity concentrations of the three buried semiconductor regions 2, 31 and 32 are $6 \times 10^{15}$ cm$^{-3}$, $4 \times 10^{15}$ cm$^{-3}$, and $2 \times 10^{15}$ cm$^{-3}$, respectively, so that the impurity concentrations become progressively lower in the order of the regions 2, 31 and 32. Incidentally, the third semiconductor region 3 has an impurity concentration of $1 \times 10^{15}$ cm$^{-3}$.

Such being the improved construction of the composite semiconductor device according to the invention, the depletion layers 25 and 27 due to the pn junctions 24 and 26 will be created as in the prior art when a voltage is applied between the drain electrode 11 and the ground electrode 12 or the source electrode 13 so as to reverse bias the pn junction 24. At the same time, depletion layers 35 and 36 will also be created due to a pn junction 33 between p type first region 1 and n type seventh region 31, and to another pn junction 34 between first region and n type eighth region 32.

Figure 4:
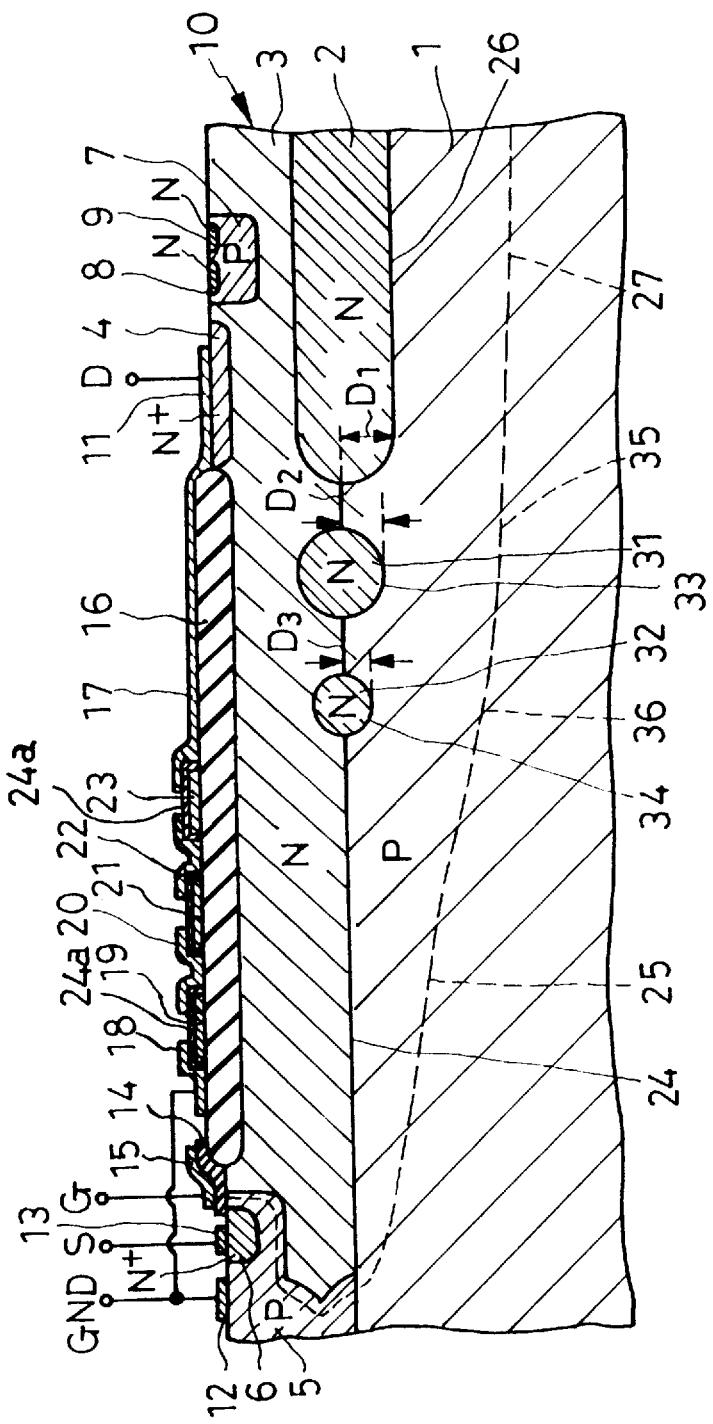
FIG. 4 is an enlarged, fragmentary section through the improved device, taken substantially along the line A—A in FIG. 3.
Figure 5:
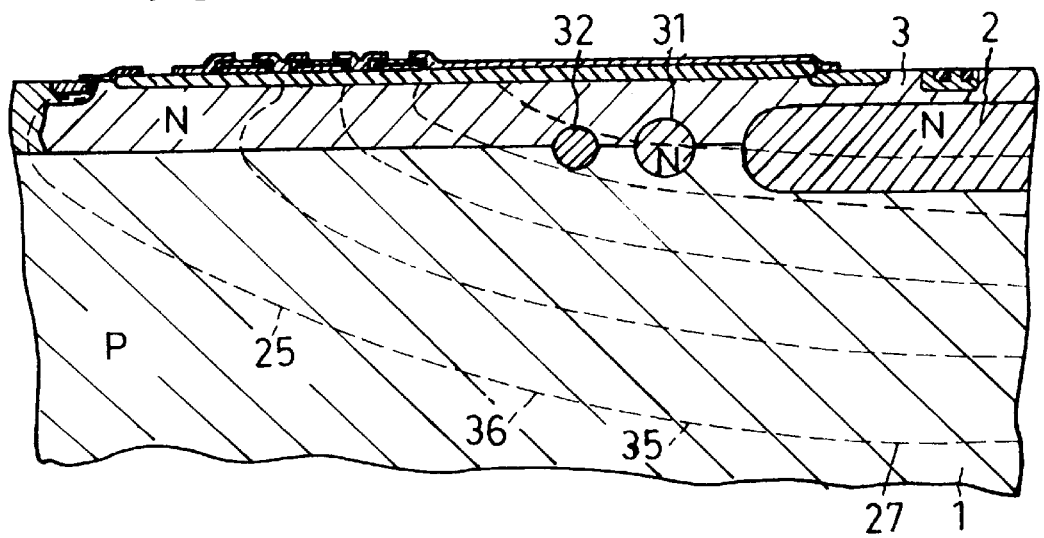
FIG. 5 is a view somewhat similar to FIG. 4 but explanatory in particular of how depletion layers are created in the improved device.

It will be appreciated that the additional depletion layers 35 and 36 serve to make smoother the transition between the depletion layers 25 and 27, as will be understood from both FIGS. 4 and 5. The transition is so streamlined, indeed, that little or not field concentrations are to occur. Thus the device will withstanding higher voltages than heretofore. It is also noteworthy that this objective is accomplished without lowering the impurity concentration of the third semiconductor region 3. The low level signal semiconductor element, comprised of the semiconductor regions 7–9, does not therefore suffer from the additional regions 31 and 32 in any way.

Figure 6:
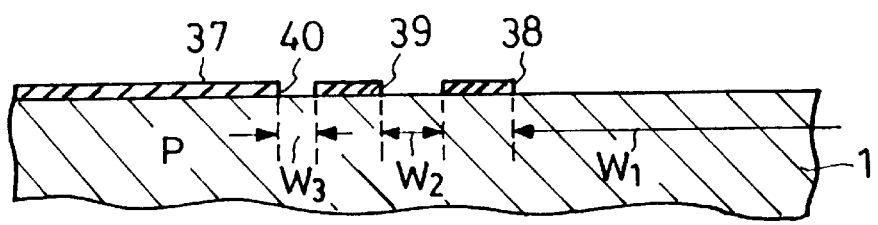
FIG. 6 is a fragmentary sectional view explanatory of a step in the fabrication of buried regions in the improved device.
Figure 7:
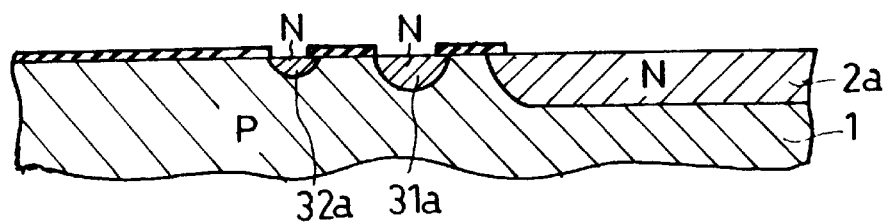
FIG. 7 a view similar to FIG. 6 but explanatory of another step in the fabrication the buried regions.
Figure 8:
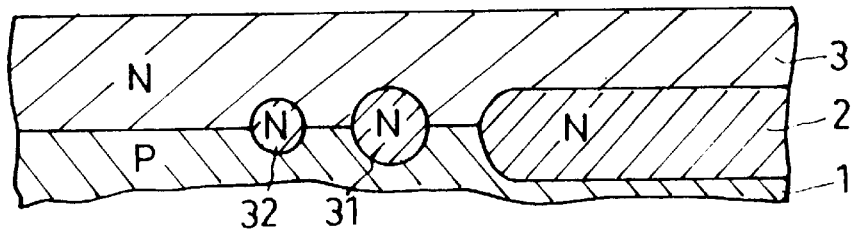
FIG. 8 is a view similar to FIG. 6 but explanatory of still another step in the fabrication of the buried regions.

How the additional buried semiconductor regions 31 and 32 are formed will become apparent from a study of FIGS. 6–8. Before creating the buried second region 2 and epitaxial third region 3, one major surface of the first region or substrate 1 may be masked with an oxide film 37, and windows 38, 39 and 40 may be formed in the masking, as illustrated in FIG. 6. The window 38, which is for the creation of the buried layer 2, is circular in shape, with a diameter $W_1$. The two other windows 39 and 40 are for the creation of the seventh and the eighth regions 31 and 32 and so annular in shape, with widths $W_2$ and $W_3$, concentrically surrounding the central window 38. $W_1 > W_2 > W_3$.

Then, as Illustrated in FIG. 7, semiconductor regions 2a, 31a and 32a may be formed in the first region 1 by n type impurity diffusion through the mask windows 38–40.

Then, with the mask 37 removed, n type silicon may be grown epitaxially on the substrate 1 as well as on the regions 2a, 31a and 32a embedded therein, thereby forming the third semiconductor region 3 shown in FIG. 8. As a result of this epitaxial growth, and of subsequent heat treatment, a partial impurity transfer will occur from the regions 2a, 31a and 32a into the third region 3, thereby completing the buried second, seventh and eighth regions 2, 31 and 32 as in FIG. 8. The simultaneous creation of the two additional buried regions 31 and 32 with the preexisting buried region 2 is preferred because the improved device according to the invention can be fabricated almost as quickly as the prior art device having no buried regions 31 and 32.

Alternatively, the three buried regions 2, 31 and 32 can be progressively varied in impurity concentration for the creation of even smoother depletion layers. Typical impurity concentrations in this case of the second region 2, seven region 31 and eighth region 32 are $6\times10^{15}$ cm$^{-3}$, $4\times10^{15}$ cm$^{-3}$, and $2\times10^{15}$ cm$^{-3}$, respectively. The impurity concentration of the third region 3 may then be $1\times10^{15}$ cm$^{-3}$. The three buried regions 2, 31 and 32 become progressively lower in impurity concentration in that order. The method of creating such buried regions of different impurity concentrations is essentially similar to that discussed above with reference to FIGS. 6–8 except that the three buried regions must be formed one after another, instead of concurrently as in the foregoing.

This alternative method also makes it possible to make the depths $D_1$, $D_2$ and $D_3$ grow less in that order. This feature, combined with the progressively lowered impurity concentrations of the three buried regions 2, 31 and 32, results in the creation of streamlined depletion layers best depicted in FIG. 5. The alternative method is of particular advantage in cases where the dimensions $W_2$ and $W_3$, FIG. 6, are significantly greater than the depth of the second region 2.

Despite the foregoing detailed disclosure, it is not desired that the present invention be limited by the exact showings of the drawings or by the description thereof. The following is a brief list of possible modifications or alterations of the illustrated embodiments:

1. The three buried regions 2, 31 and 32 could be of the same depth if their impurity concentrations were varied as in the alternative method.
2. Only one buried layer could be provided in addition to the preexisting buried layer 2.
3. Three or more buried layers could be provided in addition to the preexisting buried layer 2.
4. Two or more additional buried layers could be arranged contiguous to each other.
5. One or more additional buried layers could be arranged contiguous to the preexisting buried layer 2.
7. The low level signal semiconductor element could take the form of a bipolar transistor.

All such modifications and alterations are intended in the foregoing disclosure. It is therefore appropriate that the present invention be construed broadly and in a manner consistent with the fair meaning or proper scope of the following claims.

What is claimed is:

1. A composite semiconductor device of one piece construction having an insulating gate field effect transistor and a low level signal element, the latter being less in current carrying capacity than the field effect transistor, comprising:

(a) a first semiconductor region of a first conductivity type having a major surface;

(b) a second semiconductor region of a second conductivity type opposite to the first conductivity type, the second semiconductor region being disposed contiguous to the major surface of the first semiconductor region and partly embedded therein;

(c) a third semiconductor region of the second conductivity type being lower in impurity concentration than the second semiconductor region, the third semiconductor region being disposed contiguous to the major surface of the first semiconductor region thereby burying the second semiconductor region in and between the first and the third semiconductor regions;

(d) a fourth semiconductor region of the second conductivity type being higher in impurity concentration than the third semiconductor region, the fourth semiconductor region being formed in the third semiconductor region so as to form a drain of a field effect transistor;

(e) a fifth semiconductor region of the first conductivity type disposed contiguous to the major surface of the first semiconductor region and to the third semiconductor region while being spaced from the second semiconductor region;

(f) a sixth semiconductor region of the second conductivity type formed in the fifth semiconductor region so as to form a source of the field effect transistor;

(g) an additional buried semiconductor region of the second conductivity type being higher in impurity concentration than the third semiconductor region, the additional buried semiconductor region being buried in and between the first and the third semiconductor regions and disposed adjacent the buried second semiconductor region;

(h) a drain electrode formed on the fourth semiconductor region;

(i) a source electrode formed on the sixth semiconductor region;

(j) a gate electrode formed on the fifth semiconductor region via an insulating film;

(k) a ground electrode formed on the fifth semiconductor region; and (l) a low level signal element formed in the third semiconductor region.

2. The composite semiconductor device of claim 1 wherein the additional buried semiconductor region is embedded in the first semiconductor region to a depth less than the second semiconductor region is.

3. The composite semiconductor device of claim 1 wherein the additional buried semiconductor region is less in impurity concentration than the second semiconductor region.

4. The composite semiconductor device of claim 1 further comprising a second additional buried semiconductor region of the second conductivity type being higher impurity concentration than the third semiconductor region, the second additional buried semiconductor region being buried in and between the first and the third semiconductor regions and disposed farther away from the second semiconductor region than is the first recited additional buried semiconductor region.

5. The composite semiconductor device of claim 4 wherein the second additional buried semiconductor region is embedded in the first semiconductor region to a depth less than the first additional buried semiconductor region is.

6. The composite semiconductor device of claim 4 wherein the second additional buried semiconductor region is less impurity concentration than the first additional buried semiconductor region.

7. The composite semiconductor device of claim 1 further comprising:

(a) an oxide film formed on the third semiconductor region;

(b) a first conductive layer formed on the oxide film and electrically connected to the drain electrode;

(c) a second conductive layer formed on the oxide film and electrically connected to the ground electrode;

(d) at least one intermediate conductive layer formed on the oxide film and disposed intermediate the first and the second conductive layers; and (e) a plurality of dielectric layers disposed intermediate the first conductive layer and the intermediate conductive layer and intermediate the second conductive layer and the intermediate conductive layer.

8. The composite semiconductor device of claim 7 wherein each of the first and the second conductive layers, and the intermediat conductive layer is a metal layer.

* * * * *